United States Patent
Xu et al.

(10) Patent No.: US 10,147,343 B2
(45) Date of Patent: Dec. 4, 2018

(54) DISPLAY PANEL, METHOD FOR DRIVING THE SAME AND ANTI-PEEPING SYSTEM

(71) Applicants: BOE Technology Group Co., Ltd., Beijing (CN); Beijing BOE Display Technology Co., Ltd., Beijing (CN)

(72) Inventors: Liyan Xu, Beijing (CN); Chunbing Zhang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/576,795

(22) PCT Filed: Apr. 27, 2017

(86) PCT No.: PCT/CN2017/082197
§ 371 (c)(1),
(2) Date: Nov. 24, 2017

(87) PCT Pub. No.: WO2018/018969
PCT Pub. Date: Feb. 1, 2018

(65) Prior Publication Data
US 2018/0277026 A1 Sep. 27, 2018

(30) Foreign Application Priority Data
Jul. 29, 2016 (CN) .......................... 2016 1 0614374

(51) Int. Cl.
*G09G 3/00* (2006.01)
*G09G 3/20* (2006.01)
(Continued)

(52) U.S. Cl.
CPC ........... *G09G 3/001* (2013.01); *G09G 3/2003* (2013.01); *G09G 3/32* (2013.01); *G09G 3/3208* (2013.01); *G09G 2358/00* (2013.01)

(58) Field of Classification Search
None
See application file for complete search history.

(56) References Cited

U.S. PATENT DOCUMENTS 5,757,139 A * 5/1998 Forrest ..................... G09G 3/14
313/504
9,715,143 B2 7/2017 Li et al.
(Continued)

FOREIGN PATENT DOCUMENTS

CN 102708833 A 10/2012
CN 103353629 A 10/2013
(Continued)

OTHER PUBLICATIONS

English translation of International Search Report and Written Opinion (Chinese version was previously-submitted at the time of filing of the instant application) for International Application No. PCT/CN2017/082197, dated Jul. 31, 2017, 8 pages.

*Primary Examiner* — Matthew Yeung
(74) *Attorney, Agent, or Firm* — Westman, Champlin & Koehler, P.A.

(57) ABSTRACT

The present disclosure provides a display panel, a method for driving the same, and an anti-peeping system. The display panel comprises a substrate; and multiple pixel units arranged on the substrate in an array, each of the pixel units comprising first self-luminous devices, second self-luminous devices, and quantum dot luminous devices, wherein the first self-luminous devices and the second self-luminous devices are stacked in various sub-pixel regions, the quantum dot luminous devices are disposed in at least two sub-pixel regions, and quantum dot luminous devices disposed in different sub-pixel regions have different luminous colors, wherein the first self-luminous devices are configured to excite the quantum dot luminous devices to emit light during a display period of one frame to display a normal picture, and the second self-luminous devices are configured to be in a turn-off state during the display period of one frame and excite quantum dot luminous devices (Continued)

within a part of the sub-pixel regions to emit light during an interference period of one frame to display an interference picture. The display panel according to the embodiments of the present disclosure realizes an anti-peeping function.

20 Claims, 3 Drawing Sheets

(51) Int. Cl.
    *G09G 3/3208*    (2016.01)
    *G09G 3/32*       (2016.01)

(56) References Cited

U.S. PATENT DOCUMENTS

| | | | | |
|---|---|---|---|---|
| 2010/0117997 | A1* | 5/2010 | Haase | H01L 27/156 345/204 |
| 2012/0018764 | A1* | 1/2012 | Choi | H01L 33/20 257/99 |
| 2016/0012792 | A1 | 1/2016 | Li et al. | |

FOREIGN PATENT DOCUMENTS

| | | |
|---|---|---|
| CN | 104122705 A | 10/2014 |
| CN | 104122726 A | 10/2014 |
| CN | 106129094 A | 11/2016 |

* cited by examiner

DISPLAY PANEL, METHOD FOR DRIVING THE SAME AND ANTI-PEEPING SYSTEM

CROSS-REFERENCE TO RELATED APPLICATION(S)

This application is a Section 371 National Stage application of International Application No. PCT/CN2017/082197, filed on 27 Apr. 2017, which has not yet published, and claims priority to Chinese Patent Application No. 201610614374.1, filed on Jul. 29, 2016, which are incorporated herein by reference in their entirety.

TECHNICAL FIELD

The present disclosure relates to the field of display technologies, and more particularly, to a display panel, a method for driving the same, and an anti-peeping system.

BACKGROUND

Currently, with the development of display technologies and network technologies, more and more people conduct operations such as shopping or account transactions etc. through networks. During the above operations, operators often need to enter personal information on display devices such as computers, cell phones, automatic teller machines, automatic ticket machines etc., which may easily lead to leakage of the personal information. As a result, anti-peeping performance of the display devices increasingly gets widespread attentions, and it strives to ensure security of the personal information of the operators. In addition, special display apparatuses are required in some special industries. In particular, confidential information needs to be transmitted to specific personnel. In this case, a display device which transmits information is required to have anti-peeping performance.

Therefore, a technical problem which urgently needs to be solved by those skilled in the art is how to realize the anti-peeping function of the display device.

SUMMARY

The embodiments of the present disclosure provide a display panel, a method for driving the same, and an anti-peeping system, to at least partly solve the problem in the related art that the display devices cannot effectively realize anti-peeping.

The embodiments of the present disclosure provide a display panel, comprising: a substrate; and multiple pixel units arranged on the substrate in an array, each of the pixel units comprising first self-luminous devices, second self-luminous devices, and quantum dot luminous devices, wherein the first self-luminous devices and the second self-luminous devices are stacked in various sub-pixel regions, the quantum dot luminous devices are disposed in at least two sub-pixel regions, and quantum dot luminous devices disposed in different sub-pixel regions have different luminous colors, wherein the first self-luminous devices are configured to excite the quantum dot luminous devices to emit light during a display period of one frame to display a normal picture, and the second self-luminous devices are configured to be in a turn-off state during the display period of one frame and excite quantum dot luminous devices within a part of the sub-pixel regions to emit light during an interference period of one frame to display an interference picture.

In a possible implementation, in the display panel according to the embodiments of the present disclosure, each of the sub-pixel regions has a quantum dot luminous device disposed therein, and the quantum dot luminous devices in each of the pixel units are disposed on the same side of the substrate, and are farther from the substrate than the first self-luminous devices and the second self-luminous devices.

In a possible implementation, in the display panel according to the embodiments of the present disclosure, each of the sub-pixel regions has two quantum dot luminous devices having the same luminous color disposed therein, the two quantum dot luminous devices are disposed on opposite sides of the substrate respectively, and the quantum dot luminous devices are farther from the substrate than the first self-luminous devices and/or the second self-luminous devices.

In a possible implementation, in the display panel according to the embodiments of the present disclosure, the first self-luminous devices in the multiple pixel units are located on one side of the substrate and the second self-luminous devices in the multiple pixel units are located on the other side of the substrate.

In a possible implementation, in the display panel according to the embodiments of the present disclosure, each of the pixel units further comprises an optical filter layer disposed on one side, which is far away from the substrate, of each of the quantum dot luminous devices and configured to filter light emitted by the first self-luminous devices.

In a possible implementation, in the display panel according to the embodiments of the present disclosure, a wavelength of light emitted by the first self-luminous devices is less than that of all the quantum dot luminous devices.

In a possible implementation, in the display panel according to the embodiments of the present disclosure, the first self-luminous devices are Organic Light Emitting Diodes (OLED) or Light Emitting Diodes (LED) that emit blue light, and the quantum dot luminous devices comprise quantum dot luminous devices that emit red light and quantum dot luminous devices that emit green light.

In a possible implementation, in the display panel according to the embodiments of the present disclosure, the first self-luminous devices are OLEDs or LEDs that emit ultraviolet light, and the quantum dot luminous devices comprise quantum dot luminous devices that emit red light, quantum dot luminous device that emit green light and quantum dot luminous devices that emit blue light.

In a possible implementation, in the display panel according to the embodiments of the present disclosure, a wavelength of light emitted by the second self-luminous devices is greater than that of at least one of the quantum dot luminous devices.

In a possible implementation, in the display panel according to the embodiments of the present disclosure, the second self-luminous devices are OLEDs or LEDs that emit yellow light.

The embodiments of the present disclosure further provide a method for driving the display panel described above, comprising: during a display period of one frame, driving the first self-luminous devices in the sub-pixel regions to be in a turn-on state and the second self-luminous devices in the sub-pixel regions to be in a turn-off state; and during an interference period of one frame, driving the second self-luminous devices in a part of the sub-pixel regions to be in a turn-on state.

The embodiments of the present disclosure further provide an anti-peeping system, comprising: the display panel according to the embodiments described above; and shutter glasses having lenses configured to be in a light-transmission state during a display period of one frame and be in a light-shielding state during an interference period of one frame.

The embodiments of the present disclosure provide a display panel, a method for driving the same, and an anti-peeping system. The display panel comprises a substrate; and multiple pixel units arranged on the substrate in an array, each of the pixel units comprising first self-luminous devices, second self-luminous devices, and quantum dot luminous devices, wherein the first self-luminous devices and the second self-luminous devices are stacked in various sub-pixel regions, the quantum dot luminous devices are disposed in at least two sub-pixel regions, and quantum dot luminous devices disposed in different sub-pixel regions have different luminous colors, wherein the first self-luminous devices are configured to excite the quantum dot luminous devices to emit light during a display period of one frame to display a normal picture, and the second self-luminous devices are configured to be in a turn-off state during the display period of one frame and excite quantum dot luminous devices within a part of the sub-pixel regions to emit light during an interference period of one frame to display an interference picture. A viewer who wears corresponding shutter glasses may filter out the interference picture to view the normal picture, a picture viewed by a peeper who does not wear the shutter glasses is a superimposed picture of the normal picture and the interference picture, and thereby the peeper cannot view important information displayed by the display panel, thus realizing an anti-peeping function of the display apparatus.

DETAILED DESCRIPTION

In view of the problem in the related art that the display device cannot effectively realize anti-peeping, the embodiments of the present disclosure provide a display panel, a method for driving the same, and an anti-peeping system.

Specific implementations of the display panel and the anti-peeping system according to the embodiments of the present disclosure are described in detail below with reference to the accompanying drawings. Thicknesses and shapes of various components do not reflect true scales in the accompanying drawings and are only intended to be illustration of the present disclosure.

The embodiments of the present disclosure provide a display panel, as shown in FIGS. 1-4 and 6, comprising: a substrate 100, and multiple pixel units 200 arranged on the substrate 100 in an array. Each of the pixel units 200 comprises first self-luminous devices 101, second self-luminous devices 102, and quantum dot luminous devices 103, wherein the first self-luminous devices 101 and the second self-luminous devices 102 are stacked in various sub-pixel regions 201, the quantum dot luminous devices 103 are disposed in at least two sub-pixel regions 201, and quantum dot luminous devices 103 disposed in different sub-pixel regions 201 have different luminous colors.

The first self-luminous devices 101 are configured to excite the quantum dot luminous devices 103 to emit light during a display period of one frame to display a normal picture. The second self-luminous devices 102 are configured to be in a turn-off state during the display period of one frame and excite quantum dot luminous devices 103 within a part of the sub-pixel regions 201 to emit light during an interference period of one frame to display an interference picture.

In the display panel according to the embodiments of the present disclosure, the first self-luminous devices 101 emit light and the second self-luminous devices 102 are in a turn-off state during the display period of one frame to display a normal picture, and the second self-luminous devices 102 emit light during the interference period of one frame to display an interference picture. A viewer who wears corresponding shutter glasses may filter out the interference picture to view the normal picture, a picture viewed by a peeper who does not wear the shutter glasses is a superimposed picture of the normal picture and the interference picture, and thereby the peeper cannot view important information displayed by the display panel, thus realizing an anti-peeping function of the display panel.

Figure 5:
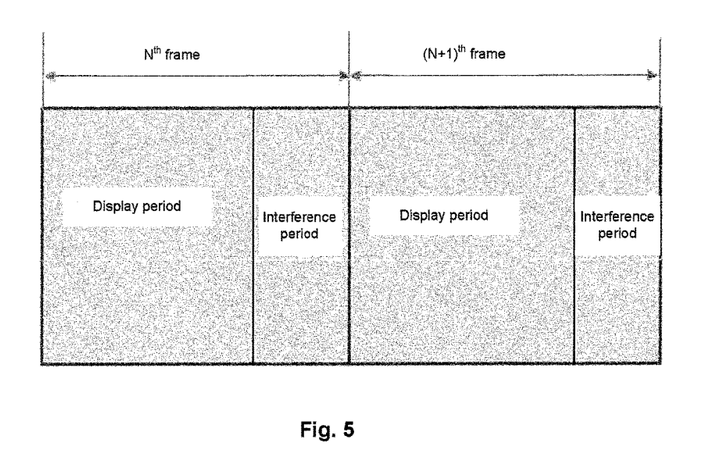
FIG. 5 is a diagram of allocation of display times in various frames during display by a display panel.

During a display time of one frame, the normal picture and the interference picture are alternately displayed. As shown in FIG. 5 (in which a display time of two frames is taken as an example), a display time of one frame is generally 1/60 s, which may result in frequent switching between the display period and the interference period that cannot be distinguished by human eyes. Therefore, a picture viewed by a peeper who does not wear shutter glasses is a superimposed picture of the normal picture and the interference picture. The interference picture may be controlled to be displayed to shield a position of important information displayed in the normal picture, for example, a mosaic picture is displayed at the position of the important information to achieve a mosaic effect, or a blurred screen is displayed to interfere with the normal picture, so as to realize the anti-peeping effect. Further, display pictures of a part of the sub-pixel regions 201 may be controlled to interfere with the position of the important information during the interference period of one frame, without controlling all the sub-pixel regions 201 for display. In addition, in practical applications, the display period is preferably greater than the interference period during the display time of one frame, so as to ensure that the viewer can clearly view the normal picture.

In a specific implementation, during the interference period of one frame, the first self-luminous devices 101 may be in a turn-off state, so that power consumption of the display panel can be saved, or the first self-luminous devices 101 may be configured to be always in a turn-on state, so that there is no need to control the first self-luminous devices 101 to be continuously turned on and turned off, which not only can simplify the control process, but also can prolong the lifetime of the first self-luminous devices 101. States of the first self-luminous devices 101 during the interference period are not limited here. In addition, two pixel units 200 are taken as an example for illustration in FIGS. 1 to 4 and 6, and the number of the pixel units 200 is not limited.

Figure 1:
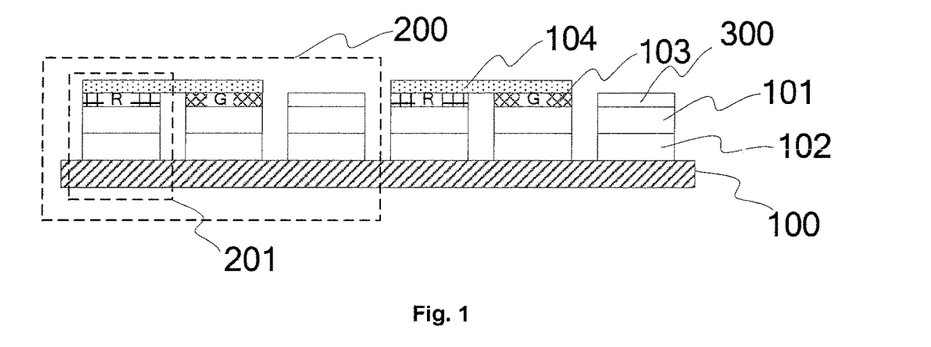
FIG. 1 is a first structural diagram of a display panel according to an embodiment of the present disclosure.
Figure 2:
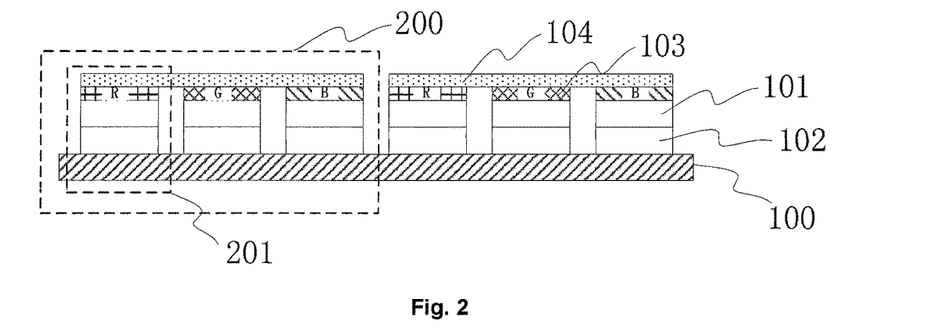
FIG. 2 is a second structural diagram of a display panel according to an embodiment of the present disclosure.
Figure 6:
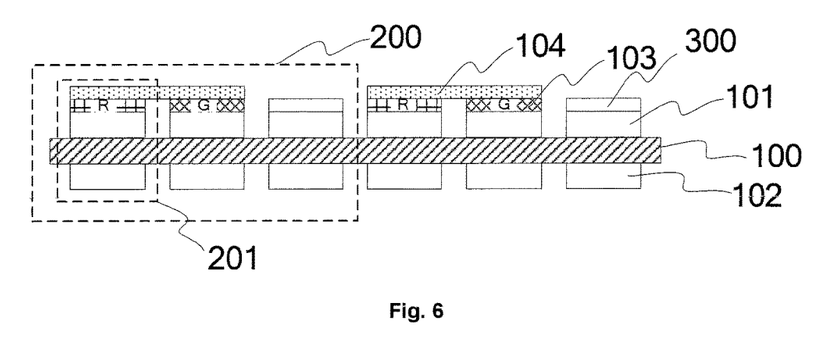
FIG. 6 is a fifth structural diagram of a display panel according to an embodiment of the present disclosure.

In practical applications, the above display panel according to the embodiments of the present disclosure can realize single-sided anti-peeping display. As shown in FIGS. 1-2 and 6, there is one quantum dot luminous device 103 disposed in the sub-pixel region 201, and various quantum dot luminous devices 103 are disposed on the same side of the substrate 100 and are located on outer sides of the first self-luminous devices 101 and the second self-luminous devices 102 with respect to the substrate 100.

Various first self-luminous devices 101 and various second self-luminous devices 102 are unidirectional self-luminous devices facing the quantum dot luminous devices 103.

Various quantum dot luminous devices 103 are disposed on the outer sides of the first self-luminous devices 101 and the second self-luminous devices 102 with respect to the substrate and are located on the same side of the substrate 100. During a display period of one frame, the first self-luminous devices 101 excite the quantum dot luminous devices 103 in various sub-pixel regions 201 to emit light, so as to display a normal picture. During an interference period of one frame, the second self-luminous devices 102 excite quantum dot luminous devices 103 in a part of the sub-pixel regions 201 to emit light, so as to display an interference picture. That is, the first self-luminous devices 101 and the second self-luminous devices 102 share the quantum dot luminous devices 103.

In addition, various first self-luminous devices 101 and various second self-luminous devices 102 are also required to be provided as unidirectional self-luminous devices facing the quantum dot luminous devices 103. In the structures shown in FIGS. 1 and 2, the first self-luminous devices 101 are located on one side, which is far away from the substrate 100, of each of the second self-luminous devices 102, that is, the second self-luminous devices 102 are located between the first self-luminous devices 101 and the substrate 100. In a specific implementation, the first self-luminous devices 101 may also be disposed between the second self-luminous devices 102 and the substrate 100, or the substrate 100 may be disposed between the first self-luminous devices 101 and the second self-luminous devices 102 as shown in FIG. 6 (in this case, the substrate 100 is required to be a transparent substrate). Positions for stacking the first self-luminous devices 101, the second self-luminous devices 102, and the substrate 100 are not limited here.

Figure 3:
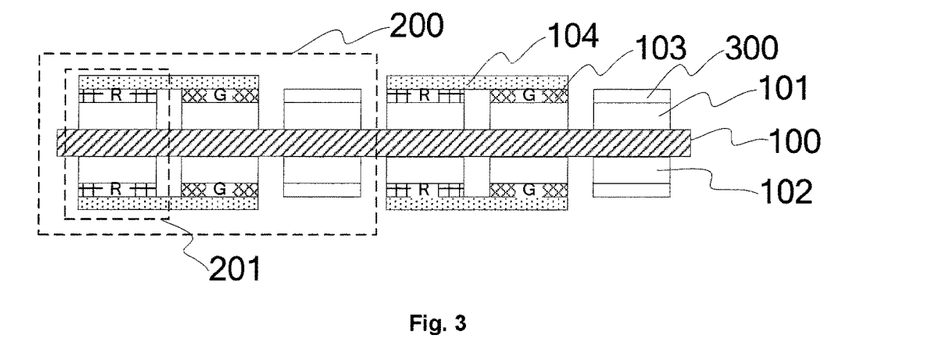
FIG. 3 is a third structural diagram of a display panel according to an embodiment of the present disclosure.
Figure 4:
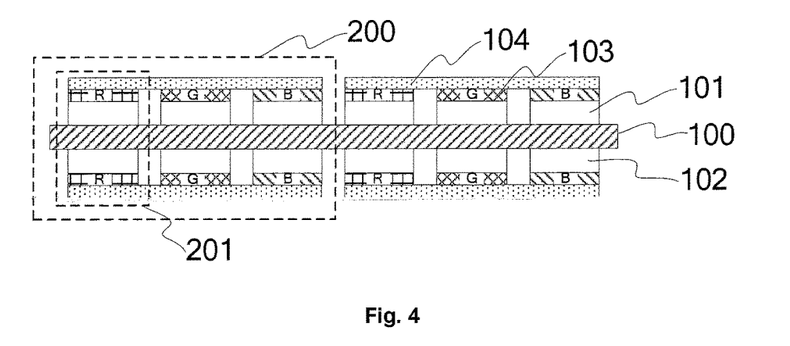
FIG. 4 is a fourth structural diagram of a display panel according to an embodiment of the present disclosure.

In practical applications, the above display panel according to the embodiments of the present disclosure can also realize double-sided anti-peeping display. As shown in FIGS. 3 and 4, two quantum dot luminous devices 103 are disposed in the sub-pixel region 201, are disposed on opposite sides of the substrate 100 respectively and have the same luminous color. Various quantum dot luminous devices 103 are located on outer sides of the first self-luminous devices 101 and the second self-luminous devices 102 with respect to the substrate 100 respectively.

Various first self-luminous devices 101 and various second self-luminous devices 102 are transparent self-luminous devices which emit light bi-directionally.

Two quantum dot luminous devices 103 are disposed in the sub-pixel region 201, are located on opposite sides of the substrate 100 respectively and have the same luminous color. Various quantum dot luminous devices 103 are located on outer sides of the first self-luminous devices 101 and the second self-luminous devices 102 with respect to the substrate 100 respectively. During the display period of one frame, the first self-luminous devices 101 excite quantum dot luminous devices 103 in various sub-pixel regions 201 which are located on outer sides of the first self-luminous devices 101 with respect to the substrate 100, so as to display a normal picture. During the interference period of one frame, the second self-luminous devices 102 excite quantum dot luminous devices 103 in a part of the sub-pixel regions 201 which are located on outer sides of the second self-luminous devices 102 with respect to the substrate 100, so as to display an interference picture. That is, the first self-luminous devices 101 and the second self-luminous devices 102 do not share the quantum dot luminous devices 103.

In addition, various first self-luminous devices 101 and various second self-luminous devices 102 are also required to be provided as transparent self-luminous devices which emit light bi-directionally. In the structures shown in FIGS. 3 and 4, the substrate 100 is located between the first self-luminous devices 101 and the second self-luminous devices 102. In a specific implementation, the first self-luminous devices 101 may also be disposed between the second self-luminous devices 102 and the substrate 100, or the second self-luminous devices may also be disposed between the first self-luminous devices 101 and the substrate 100. Positions for stacking the first self-luminous devices 101, the second self-luminous devices 102, and the substrate 100 are not limited here.

In a specific implementation, in the above display panel according to the embodiments of the present disclosure, various first self-luminous devices 101 are preferably located on the same side of the substrate 100, and various second self-luminous devices 102 are preferably located on the other side of the substrate 100, as shown in FIGS. 3-4 and 6, wherein FIGS. 3 and 4 illustrate two-sided anti-peeping display, and FIG. 6 illustrates single-sided anti-peeping display.

In a specific implementation, in the above display panel according to the embodiments of the present disclosure, each of the pixel units 200 further comprises an optical filter layer 104 disposed on outer sides of the quantum dot luminous devices 103 with respect to the substrate 100, and configured to filter out light emitted by the first self-luminous devices 101.

By taking the structure shown in FIG. 1 as an example, the quantum dot luminous devices are provided to emit light in corresponding colors under excitation of the first self-luminous devices 101 and it is not desired that the light from the first self-luminous devices 101 themselves is also emitted at positions corresponding to the quantum dot devices. Therefore, in order to achieve a better display effect of the normal picture, the optical filter layer 104 is preferably disposed on outer sides of the quantum dot luminous devices 103 with respect to the substrate 100 to filter out residual light after the first self-luminous devices 101 excite the quantum dot luminous devices 103. For the second self-luminous devices 102 for displaying the interference picture, the optical filter layer 104 is not required to be provided to filter out residual light from the second self-luminous devices 102 as the residual light from the second self-luminous devices 102 themselves may also have an effect of interfering with the normal picture.

As shown in FIGS. 1 and 3, the optical filter layer 104 is disposed at the positions corresponding to the quantum dot luminous devices 103. For the structures shown in FIGS. 2 and 4, as each of the sub-pixel regions 201 in each pixel unit 200 comprises a quantum dot luminous device 103, the above optical filter layer 104 may also be disposed as an entire layer.

In a specific implementation, in the above display panel according to the embodiments of the present disclosure, a wavelength of light emitted by the first self-luminous devices 101 is less than that of all the quantum dot luminous devices 103, which may be implemented in two ways.

In a first Implementation, as shown in FIGS. 1 and 3, the first self-luminous devices 101 are OLEDs or LEDs that emit blue light; and the quantum dot luminous devices 103 comprise quantum dot luminous devices 103 that emit red light and quantum dot luminous devices 103 that emit green light.

As the quantum dot luminous devices 103 comprise quantum dot luminous devices 103 that emit red light and quantum dot luminous devices 103 that emit green light, the first self-luminous devices 101 preferably emit blue light in order to achieve trichromatic display.

By taking FIGS. 1 and 3 as an example, in a specific implementation, in each pixel unit 200, the quantum dot luminous devices 103 comprise a quantum dot luminous device 103 that emits red light and a quantum dot luminous device 103 that emits green light, but for a sub-pixel region 201 in which no quantum dot luminous device 103 is included, a transparent device 300 may be disposed at a corresponding position to ensure flatness of the structure.

In a second implementation, as shown in FIGS. 2 and 4, the first self-luminous devices 101 are OLEDs or LEDs that emit ultraviolet light, and the quantum dot luminous devices 103 comprise quantum dot luminous device 103 that emit red light, quantum dot luminous device 103 that emit green light and quantum dot luminous device 103 that emit blue light.

The quantum dot luminous devices 103 comprise quantum dot luminous device 103 that emit red light, quantum dot luminous device 103 that emit green light and quantum dot luminous device 103 that emit blue light, so that each of the quantum dot luminous devices 103 can be excited by light having a wavelength less than that of blue light to achieve trichromatic display. Generally, each of the quantum dot luminous devices 103 is excited by ultraviolet light.

In a specific implementation, in the above display panel according to the embodiments of the present disclosure, a wavelength of light emitted by the second self-luminous devices 102 is greater than that of at least one of the quantum dot luminous devices 103. In this way, the second self-luminous devices 102 may excite the at least one of the quantum dot luminous devices 103 to emit light. Thereby, compared with displaying an interference image using single-color light emitted by the second self-luminous devices 102, a better interference effect is achieved by displaying the interference picture using light in at least two colors.

For the structures shown in FIGS. 1 and 3, a wavelength of light emitted by the second self-luminous devices 102 is greater than that of the at least one of the quantum dot luminous devices 103, that is, a wavelength of light emitted by the second self-luminous devices 102 is greater than that of green light and less than that of red light. In this case, the second self-luminous devices 102 can only excite the quantum dot luminous device 103 that emits red light, so that each pixel unit 200 may be displayed in a color of light emitted by the second self-luminous devices 102, red, or a superimposed color of both of the colors when the interference picture is displayed.

For the structures in FIGS. 2 and 4, a wavelength of light emitted by the second self-luminous devices 102 is greater than that of the at least one of the quantum dot luminous devices, which comprises two cases in which a wavelength of light emitted by the second self-luminous devices 102 is greater than that of the blue light and less than that of the green light, and a wavelength of light emitted by the second self-luminous devices 102 is greater than that of the green light and less than that of the red light. When the wavelength of light emitted by the second self-luminous devices 102 is greater than that of the blue light and less than that of the green light, the second self-luminous devices 102 may excite the quantum dot luminous device 103 that emit red light and the quantum dot luminous device 103 that emit green light, so that each pixel unit 200 may be displayed in a color of light emitted by the second self-luminous devices 102, red, green, or a superimposed color of all of the three colors when the interference picture is displayed. When the wavelength of light emitted by the second self-luminous devices 102 is greater than that of the green light and less than that of the red light, the second self-luminous devices 102 may only excite the quantum dot luminous device 103 that emit red light, so that each pixel unit 200 may be displayed in a color of light emitted by the second self-luminous devices 102, red, or a superimposed color of both of the colors when the interference picture is displayed.

In a specific implementation, in the above display panel according to the embodiments of the present disclosure, the second self-luminous devices 102 are preferably OLEDs or LEDs that emit yellow light.

Figure 7:
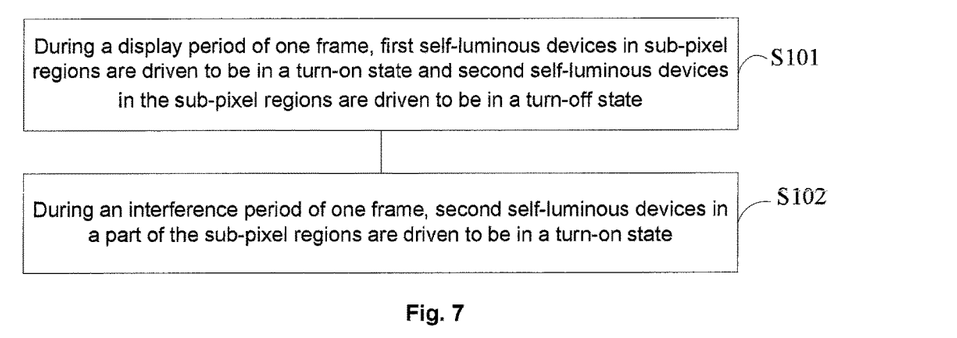
FIG. 7 is a flowchart of a method for driving a display panel according to an embodiment of the present disclosure.

Based on the same concept, the embodiments of the present disclosure further provide a method for driving the above display panel, which, as shown in FIG. 7, comprises the following steps.

In S101, during a display period of one frame, first self-luminous devices in various sub-pixel regions are driven to be in a turn-on state and second self-luminous devices in the various sub-pixel regions are driven to be in a turn-off state.

In S102, during an interference period of one frame, second self-luminous devices in a part of the various sub-pixel regions are driven to be in a turn-on state.

In the method for driving a display panel according to the embodiments of the present disclosure, the first self-luminous devices in various sub-pixel regions are controlled to be in a turn-on state and the second self-luminous devices in the various sub-pixel regions are controlled to be in a turn-off state during the display period of one frame, and the second self-luminous devices in the various sub-pixel regions are controlled to be turned on randomly, to display a blurred screen as an interference picture. In this way, a viewer who wears corresponding shutter glasses may filter out the interference picture to view the normal picture, a picture viewed by a peeper who does not wear the shutter glasses is a superimposed picture of the normal picture and the interference picture, and thereby the peeper cannot view important information displayed by the display panel, thus realizing an anti-peeping function of the display panel.

In the above step S102, the states of the first self-luminous devices are not limited, that is, the first self-luminous devices may be turned on or turned off during an interference period of one frame. When the first self-luminous devices are in a turn-on state during the interference period of one frame, as the first self-luminous devices are always in a turn-on state, there is no need to control the first self-luminous devices to be turned on and turned off continuously. In this way, not only the control process can be simplified, but also the lifetime of the first self-luminous devices can be prolonged. When the first self-luminous devices are in a turn-off state during the interference period of one frame, the power consumption of the display panel can be saved.

Based on the same concept, the embodiments of the present disclosure provide an anti-peeping system, comprising: the display panel according to the various embodiments described above; and shutter glasses having lenses configured to be in a light-transmission state during a display period of one frame, and in a light-shielding state during an interference period of one frame.

The shutter glasses are controlled to be in a light-transmission state during a display period of one frame and be in a light-shielding state during an interference period of one frame, so as to filter out an interference picture which is displayed by the display panel in the interference period. In this way, a viewer who wears the shutter glasses can view a normal picture displayed by the display panel, a picture viewed by a peeper who does not wear the shutter glasses is a superimposed picture of the normal picture and the interference picture, and thereby the peeper cannot view important information displayed by the display panel, thus realizing an anti-peeping function of the display apparatus.

In the display panel, the method for driving the same, and the anti-peeping system according to the embodiments of the present disclosure, the first self-luminous devices emit light and the second self-luminous devices are in a turn-off state during the display period of one frame, to display the normal picture, and the second self-luminous devices emit light during the interference period of one frame, to display the interference picture. A viewer who wears corresponding shutter glasses may filter out the interference picture to view the normal picture, a picture viewed by a peeper who does not wear the shutter glasses is a superimposed picture of the normal picture and the interference picture, and thereby the peeper cannot view important information displayed by the display panel, thus realizing an anti-peeping function of the display panel.

Obviously, various modifications and variations can be made to the present disclosure by those skilled in the art without departing from the spirit and scope of the present disclosure. In this way, if these modifications and variations of the present disclosure fall within the scope of the claims and the equivalent technologies of the present disclosure, the present disclosure is also intended to include these modifications and variations.

We claim:

1. A display panel, comprising:
a substrate; and
multiple pixel units arranged on the substrate in an array, each of the pixel units comprising first self-luminous devices, second self-luminous devices, and quantum dot luminous devices, wherein the first self-luminous devices and the second self-luminous devices are stacked in various sub-pixel regions, the quantum dot luminous devices are disposed in at least two sub-pixel regions, and quantum dot luminous devices disposed in different sub-pixel regions have different luminous colors,
wherein the first self-luminous devices are configured to excite the quantum dot luminous devices to emit light during a display period of one frame so as to display a normal picture, and
the second self-luminous devices are configured to be in a turn-off state during the display period of one frame and excite quantum dot luminous devices within a part of the sub-pixel regions to emit light during an interference period of one frame so as to display an interference picture.

2. The display panel according to claim 1, wherein each of the sub-pixel regions has a quantum dot luminous device disposed therein, and
the quantum dot luminous devices in each of the pixel units are disposed on a same side of the substrate, and are farther from the substrate than the first self-luminous devices and the second self-luminous devices.

3. The display panel according to claim 1, wherein each of the sub-pixel regions has two quantum dot luminous devices having a same luminous color disposed therein, the two quantum dot luminous devices are disposed on opposite sides of the substrate, respectively, and the quantum dot luminous devices are farther from the substrate than the first self-luminous devices and/or the second self-luminous devices.

4. The display panel according to claim 2, wherein the first self-luminous devices in the multiple pixel units are located on one side of the substrate and the second self-luminous devices in the multiple pixel units are located on the other side of the substrate.

5. The display panel according to claim 2, wherein each of the pixel units further comprises an optical filter layer disposed on one side, which is far away from the substrate, of each of the quantum dot luminous devices and configured to filter light emitted by the first self-luminous devices.

6. The display panel according to claim 1, wherein a wavelength of light emitted by the first self-luminous devices is less than that of all the quantum dot luminous devices.

7. The display panel according to claim 6, wherein the first self-luminous devices are Organic Light Emitting Diodes (OLED) or Light Emitting Diodes (LED) that emit blue light, and the quantum dot luminous devices comprises quantum dot luminous devices that emit red light and quantum dot luminous devices that emit green light.

8. The display panel according to claim 6, wherein the first self-luminous devices are Organic Light Emitting Diodes (OLED) or Light Emitting Diodes (LED) that emit ultraviolet light, and the quantum dot luminous devices comprise quantum dot luminous devices that emit red light, quantum dot luminous device that emit green light and quantum dot luminous devices that emit blue light.

9. The display panel according to claim 7, wherein a wavelength of light emitted by the second self-luminous devices is greater than that of at least one of the quantum dot luminous devices.

10. The display panel according to claim 9, wherein the second self-luminous devices are OLEDs or LEDs that emit yellow light.

11. A method for driving the display panel according to claim 1, comprising:
during a display period of one frame, driving the first self-luminous devices in the sub-pixel regions to be in a turn-on state and the second self-luminous devices in the sub-pixel regions to be in a turn-off state; and
during an interference period of one frame, driving the second self-luminous devices in a part of the sub-pixel regions to be in a turn-on state.

12. An anti-peeping system, comprising:
the display panel according to claim 1; and
shutter glasses having lenses configured to be in a light-transmission state during a display period of one frame and be in a light-shielding state during an interference period of one frame.

13. The display panel according to claim 3, wherein the first self-luminous devices in the multiple pixel units are located on one side of the substrate and the second self-luminous devices in the multiple pixel units are located on the other side of the substrate.

14. The display panel according to claim 3, wherein each of the pixel units further comprises an optical filter layer disposed on one side, which is far away from the substrate, of each of the quantum dot luminous devices and configured to filter light emitted by the first self-luminous devices.

15. The display panel according to claim 2, wherein a wavelength of light emitted by the first self-luminous devices is less than that of all the quantum dot luminous devices.

16. The display panel according to claim 3, wherein a wavelength of light emitted by the first self-luminous devices is less than that of all the quantum dot luminous devices.

17. The display panel according to claim 8, wherein a wavelength of light emitted by the second self-luminous devices is greater than that of at least one of the quantum dot luminous devices.

18. A method for driving the display panel according to claim 2, comprising:
   during a display period of one frame, driving the first self-luminous devices in the sub-pixel regions to be in a turn-on state and the second self-luminous devices in the sub-pixel regions to be in a turn-off state; and
   during an interference period of one frame, driving the second self-luminous devices in a part of the sub-pixel regions to be in a turn-on state.

19. A method for driving the display panel according to claim 3, comprising:
   during a display period of one frame, driving the first self-luminous devices in the sub-pixel regions to be in a turn-on state and the second self-luminous devices in the sub-pixel regions to be in a turn-off state; and
   during an interference period of one frame, driving the second self-luminous devices in a part of the sub-pixel regions to be in a turn-on state.

20. An anti-peeping system, comprising:
   the display panel according to claim 2; and
   shutter glasses having lenses configured to be in a light-transmission state during a display period of one frame and be in a light-shielding state during an interference period of one frame.

* * * * *